Dec. 19, 1961 H. SHER ET AL 3,014,187

VARIABLE STEP ATTENUATOR

Filed May 16, 1960

INVENTORS
HAROLD SHER
RAYMOND F. HERTER
BY Albert F. Kronman
ATTORNEY

United States Patent Office 3,014,187
Patented Dec. 19, 1961

3,014,187

VARIABLE STEP ATTENUATOR

Harold Sher and Raymond F. Herter, Red Bank, N.J., assignors to United Telecontrol Electronics, Inc., a corporation of New Jersey Filed May 16, 1960, Ser. No. 29,357
6 Claims. (Cl. 333—81)

This invention relates to a variable step attenuator which may be inserted into a transmission or measuring circuit and varied over a wide range of step values. The invention has particular reference to a series of attenuator circuits, each of which may be switched into or out of the circuit independently of other attenuator circuits.

Many attenuator circuits have been designed and used for measuring circuits and other uses where a definite power ratio between input and output terminals is desired. Some of the prior attenuators were not properly shielded and for this reason could not be used with supersonic or radio frequencies. Other forms of variable attenuators had switching arrangements which varied the input and output impedance of the attenuator circuit as parts of the circuit were switched in and out. Still other forms varied the capacity between resistor elements during the switching operation. The present invention solves all of these difficulties and in addition produces a large number of equal steps of attenuation with only a few attenuator circuits. The design is such that all the attenuator switches can be controlled by a single dial and all the available attenuator steps can be indicated on the dial face.

One of the objects of this invention is to provide an improved variable step attenuator which avoids one or more of the disadvantages and limitations of prior art attenuators.

Another object of the invention is to provide a convenient and flexible means for varying the attenuation in an electric circuit by a large number of small steps.

Another object of the invention is to provide a system of attenuator switches so that any attenuator component or combination of components may be switched into or out of a circuit.

Another object of the invention is to provide a shielding means for each attenuator component so that the attenuator calibration remains constant for all values of audio, supersonic, and radio frequencies up to several hundred megacycles.

Another object of the invention is to reduce stray capacity between resistive components by a novel shielding and switching combination.

Another object of the invention is to reduce the number of attenuator components necessary for covering an extended range of step values.

The invention includes a variable step attenuator having input terminals for the application of electric power and output terminals for connection to an external circuit or load. The attenuator comprises a plurality of circuits arranged in series between the input and output terminals and each of these circuits are enclosed in a shielded container. A switch is associated with each of the circuits for switching it into and out of the series arrangement, this switch being operated by mechanical means external to the shield. A plurality of cams are generally used to operate the switches, these cams being secured to a single shaft; however, other mechanical means may be employed to operate the switches.

One feature of the invention includes a circular arrangement of the shielded attenuator circuits with the operating shaft rotatably supported at the central axis of the circuit arrangement.

For a better understanding of the present invention, together with other and further objects thereof, reference is made to the following description taken in connection with the accompanying drawings.

Figure 1:
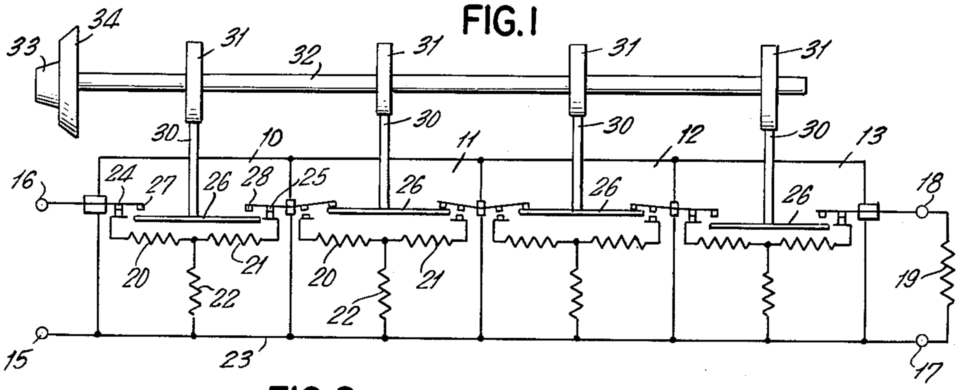
FIGURE 1 is a schematic diagram of connections showing one arrangement of shielded attenuator circuits operated by a series of cams secured to a single shaft.

Referring now to FIGURE 1 the attenuator is made up of a series of compartments 10, 11, 12, and 13. Input terminals 15 and 16 are for connection to a power source which applies electrical power to the circuit installed within container 10. Output terminals 17 and 18 are for connection to a load 19 or to any other form of electrical circuit desired. The output terminals are connected to a portion of the attenuator circuit in compartment 13.

Figure 2:
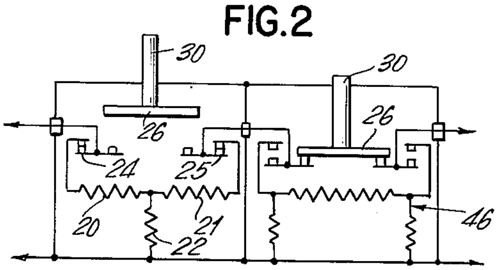
FIGURE 2 is a schematic diagram of connections showing a slightly different form of attenuator switch and also a pi attenuator network.

Each attenuator circuit as shown in FIGURE 1 includes two series resistors 20 and 21 with a shunt resistor 22 connected between the junction point of the series resistors and a common conductor 23 which also connects input terminal 15 with output terminal 17. It is within the scope of the invention to use the pi type of attenuator network 46 as illustrated in FIGURE 2.

The ends of resistors 20 and 21 are connected to contacts 24 and 25 which are closed when the attenuator circuit is switched into the attenuator system. The other parts of contacts 24 and 25 are connected respectively to input terminal 16 and the next succeeding similar pair of contacts in the next compartment 11. A short-circuiting conductor 26 is installed in each compartment and cooperates with contact points 27 and 28 to short-circuit the resistors 20 and 21 and also open contacts 24 and 25. The shorting conductor 26 is shown in its normal position in compartments 10 and 13 and in its operating position in compartments 11 and 12. It will be noted that when the conductor 26 is raised, resistors 20 and 21 are entirely disconnected from the circuit and the conductor 26 is switched into the circuit providing a direct connection between the input and output wires connected through the compartment walls.

Each conductor 26 is operated by a short insulated rod 30 and this rod is resiliently pressed against a rotatable cam 31. All the cams are secured to a common shaft 32 which is turned by a knob 33 equipped with a dial 34. The rotatable cams 31 are arranged with cut-out portions so that, as the shaft is turned, the cam follower rods 30 may be operated in a predetermined sequential manner to switch any desired combination of attenuator circuits into or out of the attenuator system.

It should be noted that the ability to select any combination of attenuator circuits into the attenuator combination makes possible as many as fifteen different steps of any desired step value by the use of only five attenuator circuits in five compartments. For example, for a combination of steps of five decibels each, the attenuation values for the five circuits are 5, 10, 20, 20, 20 decibels. Other combinations may include the usual 1, 2, 2, 5 values to give a total attenuation value of 10, or any other desired combination may be used.

The circuit shown in FIGURE 2 is the same as the circuit shown in FIGURE 1 except that the short circuiting conductor 26 is pulled away from the attenuator components when these components are switched into the circuit. This arrangement provides a lower capacity value between contacts 24 and 25.

Figure 3:
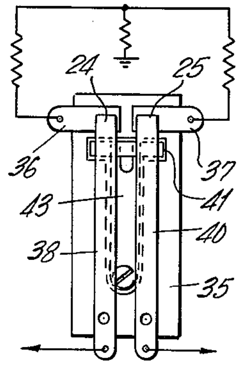
FIGURE 3 is a plan view of an attenuator switch with a schematic diagram showing how the attenuator components are connected.
Figure 4:
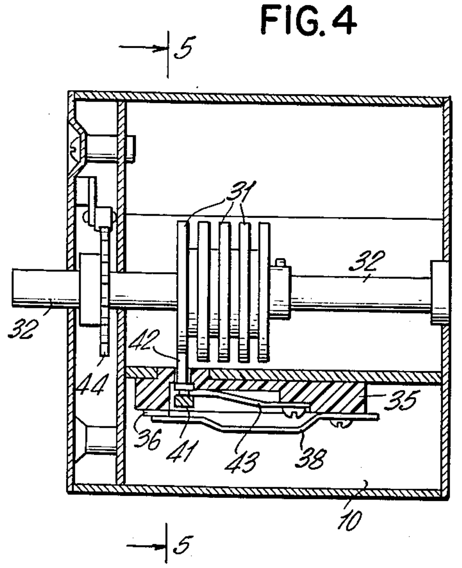
FIGURE 4 is a cross sectional view of a particular form of the attenuator showing one of the switches in cross section and indicating a cam means for controlling the switch.
Figure 5:
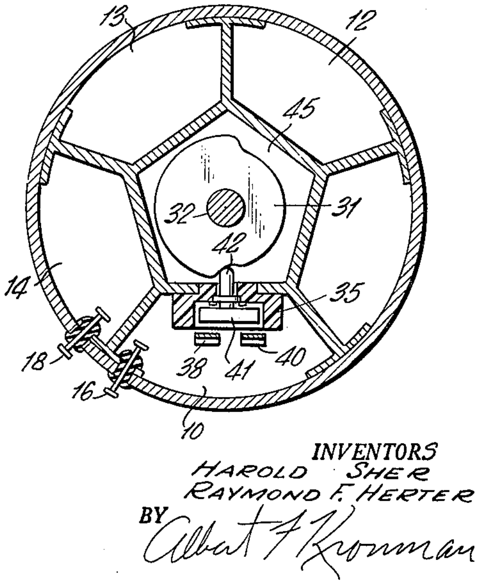
FIGURE 5 is a cross sectional view of the attenuator shown in FIGURE 4 and is taken along line 5—5 of that figure. For the sake of clarity only one switch is shown and the resistor components are eliminated.

FIGURE 3 is a plan view of a switch as actually made up for use in one of the circuit compartments. This same form of switch is also shown in FIGURES 4 and 5. The switch units are mounted on a block of insulation 35 which contains some cut-out portions for receiving the switch conductors. Contacts 24 and 25 are formed by the junctions of two flat plates 36 and 37 and two longer spring-like conductors 38 and 40. The short-circuiting conductor in this form of switch is made of a short bar 41 secured to an insulating rod 42. Bar 41 is resiliently stressed by a spring member 43 which may be a flat spring or a spring wire to keep the bar 41 in its non-conducting position as indicated in FIGURES 4 and 5. In the arrangement shown in FIGURES 4 and 5, five compartments 10 to 14 are grouped in a circular fashion around a central compartment 45 which houses the cams 31 and the common operating shaft 32. It will be evident that as the shaft 32 rotates, the cam 31 pushes rod 42 down (see FIGURES 4 and 5) and pushes the rod conductor 41 into contact with springs 38 and 40, lifting them away from contacts 36 and 37. This action effectively cuts the attenuator circuit components 20, 21, and 22 out of the system and connects the two adjoining circiuts together. It is obvious that a detent wheel 44 as shown in FIGURE 4 may be employed to stabilize the positions of shaft 32.

From the above description it will be evident that the attenuator herein described can be used to vary the attenuation value by many incremental steps since each individual attenuator circuit may be switched into or out of the attenuator arrangement independently of all other attenuator circuits.

Having thus fully described the invention, what is claimed as new and desired to be secured by Letters Patent of the United States is:

1. A variable step attenuator comprising input terminals for the application of electric power, output terminals for connection to a load, a plurality of attenuator circuits arranged in series between said input and output terminals, each of said circuits enclosed in a shielded container and all of said containers arranged in circular fashion about a central axis, a switch associated with each of said circuits for switching it into and out of the series arrangement, said switch including a shorting conductor operated by an insulated cam follower which switches an attenuator out of the series circuit by making contact with a pair of normally closed switch points and separating them, said switch independently operated by a rotatable cam secured to a shaft which is mounted in alignment with said axis.

2. A variable step attenuator as claimed in claim 1 wherein each of said switches include a rod cam follower which extends through a wall of said shielded container and is resiliently stressed against said rotatable cam.

3. A variable step attenuator as claimed in claim 1 wherein a plurality of rotatable cams are secured to said shaft which is coupled to a dial indicator and a detent wheel.

4. A variable step attenuator as claimed in claim 1 wherein each of said attenuator circuits includes two series resistors and one shunt resistor connected between an input terminal and an output terminal.

5. A variable step attenuator as claimed in claim 1 wherein each of said attenuator circuits includes one series resistor and two shunt resistors connected between the ends of the series resistor and a common conductor connected between an input terminal and an output terminal.

6. A variable step attenuator comprising a generally cylindrical casing, a cam compartment disposed axially therein, a cam shaft axially mounted for rotation in said compartment and extending through at least one wall of said casing, a plurality of cams mounted on said shaft; a plurality of switch housings concentrically disposed about said cam compartment and within said casing, a switch unit within each of said housings, each said switch unit comprising pairs of switch points, a shorting conductor, and a cam follower, said cam follower journalled in said switch unit and extending into engagement with one of said cams; an attenuator network comprising a plurality of attenuator circuits normally connected in series, each of said circuits being associated with switch points of one of said switch units, each of said shorting conductors being actuated by one of said cam followers upon rotation of said cam shaft to make contact with a switch point of each said pairs and separate the same thereby removing the associated attenuator circuit from the attenuator network to alter the attenuation value of said network.

References Cited in the file of this patent

UNITED STATES PATENTS

| | | |
|---|---|---|
| 2,493,653 | Bowyer-Lowe | Jan. 3, 1950 |
| 2,597,090 | Freeman | May 20, 1952 |

FOREIGN PATENTS

| | | |
|---|---|---|
| 546,205 | Great Britain | July 2, 1942 |
| 763,641 | Great Britain | Dec. 12, 1956 |